(12) United States Patent
Krivokapic

(10) Patent No.: US 6,913,959 B2
(45) Date of Patent: Jul. 5, 2005

(54) METHOD OF MANUFACTURING A SEMICONDUCTOR DEVICE HAVING A MESA STRUCTURE

(75) Inventor: Zoran Krivokapic, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 2 days.

(21) Appl. No.: 10/601,401

(22) Filed: Jun. 23, 2003

(65) Prior Publication Data

US 2005/0003593 A1 Jan. 6, 2005

(51) Int. Cl.[7] .............................................. H01L 21/336
(52) U.S. Cl. ....................... 438/197; 438/151; 438/164; 438/300
(58) Field of Search ................................ 438/39–41, 47, 438/151, 164, 197, 191, 299, 300–302, 312, 339, 341, 343, 364, 479, 713

(56) References Cited

U.S. PATENT DOCUMENTS

| | | | |
|---|---|---|---|
| 5,397,904 A | * | 3/1995 | Arney et al. .................. 257/66 |
| 5,443,992 A | * | 8/1995 | Risch et al. ................. 438/270 |
| 5,612,230 A | | 3/1997 | Yuzurihara et al. |
| 5,905,286 A | * | 5/1999 | Iwamatsu et al. ............ 257/347 |
| 6,037,196 A | * | 3/2000 | Schwalke .................... 438/151 |
| 6,080,612 A | * | 6/2000 | Hsu .............................. 438/202 |
| 6,200,866 B1 | * | 3/2001 | Ma et al. ..................... 438/299 |
| 6,207,511 B1 | | 3/2001 | Chapman et al. |
| 6,271,065 B1 | * | 8/2001 | Miyamoto et al. .......... 438/164 |
| 6,300,198 B1 | * | 10/2001 | Aeugle et al. ............... 438/268 |
| 6,339,002 B1 | * | 1/2002 | Chan et al. .................. 438/283 |
| 2001/0036731 A1 | | 11/2001 | Muller et al. |
| 2002/0003256 A1 | | 1/2002 | Maegawa |
| 2002/0177263 A1 | | 11/2002 | Hanafi et al. |
| 2003/0025126 A1 | | 2/2003 | Hsu |
| 2003/0057486 A1 | | 3/2003 | Gambino et al. |
| 2004/0197969 A1 | * | 10/2004 | Chen et al. .................. 438/161 |

FOREIGN PATENT DOCUMENTS

| WO | 2004/044992 | 5/2004 |
|---|---|---|

OTHER PUBLICATIONS

M.V. Fischetti and S.E. Laux, Band structure, deformation potentials, and carrier mobility in strained Si, Ge, and SiGe alloys, Thomas J. Watson Research Center, J.Appl. Phys. 80(4), Aug. 15, 1996, pp. 2234–2252.

K. Ota, K. Sugihara, H. Sayama, T. Uchida, H. Oda, T. Eimori, H. Morimoto and Y. Inoue, Novel Locally Strained Channel Technique for High Performance 55nm CMOS, IEDM Technical Digest, Dec. 8, 2002, pp. 27–30.

A. Shimizu, K. Hachimine, N. Ohki, H. Ohta, M. Koguchi, Y. Nonaki, H. Sato, and F. Ootsuka, Local Mechanical–Stress Control (CMC): A New Technique for CMOS–Performance Enhancement, IEDM Technical Digest, Dec. 2, 2001, pp. 433–436.

* cited by examiner

*Primary Examiner*—Lynne A. Gurley
*Assistant Examiner*—Stanetta Isaac
(74) *Attorney, Agent, or Firm*—Rennie Wm. Dover; Paul Drake

(57) ABSTRACT

A strained semiconductor device suitable for use in an integrated circuit and a method for manufacturing the strained semiconductor device. A mesa isolation structure is formed from a semiconductor-on-insulator substrate. A gate structure is formed on the mesa isolation structure. The gate structure includes a gate disposed on a gate dielectric material and has two sets of opposing sidewalls. Semiconductor material is selectively grown on portions of the mesa isolation structure adjacent a first set of opposing sidewalls of the gate structure and then doped. The doped semiconductor material is silicided and protected by a dielectric material. The gate is silicided wherein the silicide wraps around a second set of opposing sidewalls and stresses a channel region of the semiconductor device.

24 Claims, 4 Drawing Sheets

METHOD OF MANUFACTURING A SEMICONDUCTOR DEVICE HAVING A MESA STRUCTURE

FIELD OF THE INVENTION

The present invention relates, in general, to a semiconductor device and, more particularly, to carrier mobility in the semiconductor device and to a method for manufacturing the semiconductor device.

BACKGROUND OF THE INVENTION

Integrated circuits such as microprocessors, digital signal processors, microcontrollers, memory devices, and the like typically contain millions of Insulated Gate Field Effect Transistors (IGFETs). Because of the desire to increase the speed of the transistors or devices making up the integrated circuits, integrated circuit manufacturers have decreased the device sizes. Although the smaller devices are capable of operating at increased speeds, secondary performance factors such as decreased source-drain breakdown voltage, increased junction capacitance, and instability of the threshold voltage negatively affect transistor performance. Collectively, these adverse performance effects are referred to as short channel effects.

Techniques for increasing device speed have shifted from shrinking device sizes to improving carrier mobility and to mitigating short channel effects. For example, short channel effects can be mitigated by adjusting the electric field in the channel region to minimize the peak lateral electric field of the drain depletion region. One technique for lowering the lateral electric field is to include source and drain extension regions. Another technique suitable for increasing carrier mobility and mitigating short channel effects is to manufacture the devices on a Silicon-On-Insulator (SOI) substrate. Mobility can be further increased by straining the semiconductor devices. A drawback in manufacturing strained semiconductor devices has been the inability to develop large scale manufacturing processes capable of producing semiconductor devices that are under substantially the same amount of strain.

Accordingly, what is needed is a semiconductor device having a predetermined amount of strain and a method for manufacturing the semiconductor device.

SUMMARY OF THE INVENTION

The present invention satisfies the foregoing need by providing a semiconductor device having a strained channel region and a method for manufacturing the semiconductor device. In accordance with one aspect, the present invention includes forming a mesa structure from a semiconductor substrate, wherein the mesa structure has a first surface and first and second sidewalls. A gate structure having a gate surface and first and second sides is formed over the mesa structure, wherein first and second portions of the gate structure are disposed on the first and second sidewalls, respectively. Portions of the semiconductor substrate adjacent the first and second sides of the gate structure are doped.

In accordance with another aspect, the present invention includes a method for manufacturing a strained semiconductor device suitable for use in an integrated circuit. A semiconductor-on-insulator mesa isolation structure having a top surface and first and second sidewalls is provided. A gate dielectric material is formed on the top surface and the first and second sidewalls and a gate is formed on the gate dielectric material, wherein the gate and the gate dielectric material cooperate to form a gate structure having a top surface and gate sidewalls. A semiconductor material is formed on portions of the top surface of the mesa isolation structure adjacent to the first and second sidewalls. Silicide is formed from the semiconductor material and from the gate, wherein the silicide from the gate strains the semiconductor-on-insulator mesa isolation structure.

In accordance with yet another aspect, the present invention comprises a method for straining a semiconductor device. A semiconductor substrate comprising a first layer of semiconductor material is disposed over a layer of dielectric material, wherein the semiconductor substrate has a top surface and isolation side walls. A gate structure having a gate surface, first and second opposing gate sidewalls, and third and fourth opposing sides is formed on the semiconductor substrate. Silicide is formed from the gate surface and the first and second opposing sidewalls of the gate structure, wherein the silicide strains the semiconductor material of the semiconductor substrate.

In accordance with yet another embodiment, the present invention includes a strained semiconductor device suitable for use in an integrated circuit. The strained semiconductor device comprises a semiconductor-on-insulator substrate in a mesa isolation configuration. A gate structure having a gate surface, first and second opposing sidewalls, and third and fourth opposing sidewalls is disposed on the semiconductor-on-insulator substrate. First and second doped regions are adjacent the third and fourth sidewalls, respectively, of the gate structure. First and second silicide regions are disposed on the first and second doped regions, respectively. A gate silicide is disposed on the gate, wherein the gate silicide strains a channel region of the semiconductor device.

BRIEF DESCRIPTION OF THE DRAWINGS

The present invention will be better understood from a reading of the following detailed description, taken in conjunction with the accompanying drawing figures, in which like reference numbers designate like elements and in which.

DETAILED DESCRIPTION

Generally, the present invention provides an integrated circuit that includes a strained semiconductor device or transistors and a method for manufacturing the strained semiconductor device. The semiconductor device is strained to increase the mobility of the electrons and holes in its channel region. In accordance with one embodiment, the combination of a mesa isolation structure and a silicided gate structure increases the hole mobility by causing the channel region to be under a compressive stress. In accordance with another embodiment, the combination of underetching the buried oxide of the mesa structure and wrapping a gate dielectric and a gate material around the underetched mesa structure increases the electron and hole mobilities by causing the channel region to be under tensile stress. In these embodiments, the silicide is preferably nickel silicide. The stress can be further increased by annealing the silicide at an elevated temperature. For example, the tensile stress of a nickel silicide gate is approximately 800 Mega-Pascals (MPa) when annealed at a temperature of 360° C. and approximately 1.25 GigaPascals (GPa) when annealed at a temperature of 400° C. In accordance with yet another embodiment, the channel region is maintained under tensile stress by manufacturing the gate to have a width of less than approximately 250 nm.

Figure 1:
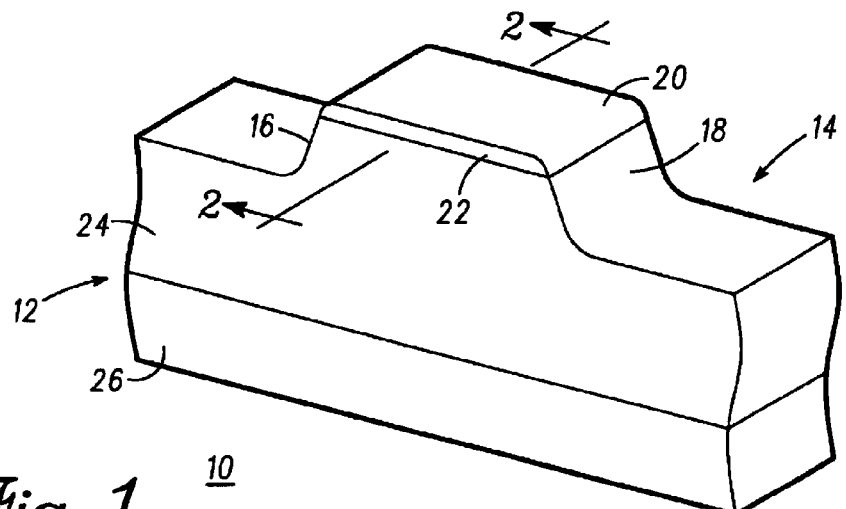
FIG. 1 is a perspective view of a portion of a semiconductor device at a beginning stage of manufacture in accordance with an embodiment of the present invention.

FIG. 1 is a perspective view of a portion of a semiconductor device 10 during manufacture in accordance with an embodiment of the present invention. What is shown in FIG. 1 is a Semiconductor-On-Insulator (SOI) substrate 12 patterned to include a mesa isolation structure 14 having a substrate surface 20 and sidewalls 16 and 18. SOI substrate 12 comprises a layer of semiconductor material 22 disposed on a layer of dielectric material 24 which is disposed on a body of semiconductor material 26. Preferably, layer of semiconductor material 22 is undoped silicon having a thickness ranging from that of a monolayer of silicon to approximately 25 nanometers (nm) and dielectric layer 24 has a thickness ranging between approximately 50 nanometers and approximately 500 nm. More preferably, silicon layer 22 has a thickness of less than 10 nm and dielectric layer 24 has a thickness of about 200 nm. Substrate surface 22 is also referred to as a top surface of the substrate or an active surface. Techniques for forming mesa isolation structures are known to those skilled in the art.

Figure 2:
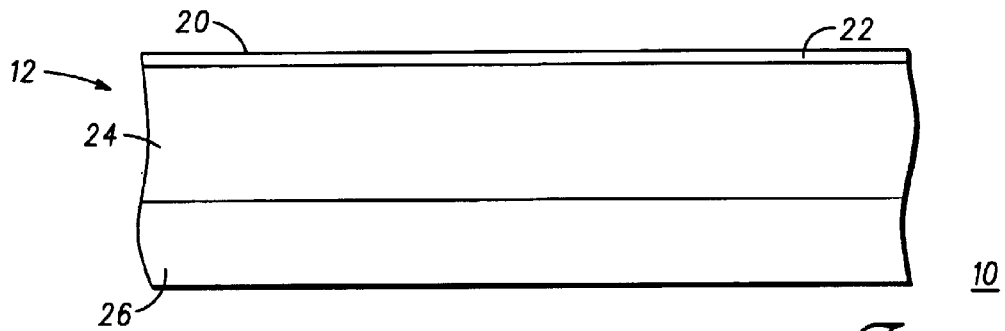
FIG. 2 is a cross-sectional side view of the device of FIG. 1 taken along section line 2—2.

Referring now to FIG. 2, patterned SOI substrate 12 taken along section line 2—2 of FIG. 1 is shown. More particularly, FIG. 2 is a cross-sectional side view showing substrate surface 20, silicon layer 22, silicon dioxide layer 24, and silicon layer 26.

Figure 3:
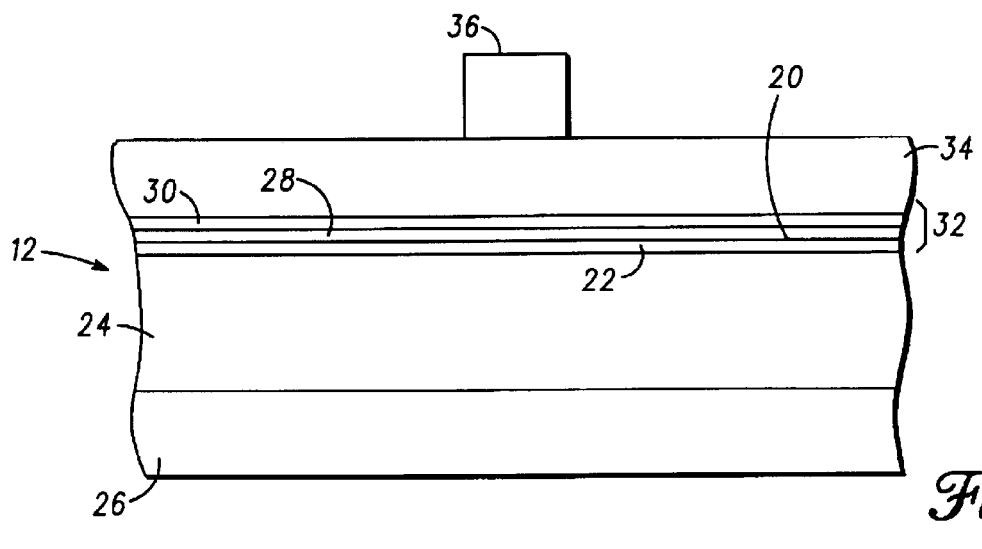
FIG. 3 is a cross-sectional side view of the semiconductor device of FIG. 2 further along in processing.

Referring now to FIG. 3, a layer of dielectric material 28 is formed on substrate surface 20 and a dielectric material 30 is formed on dielectric material 28. By way of example, dielectric material 28 is silicon dioxide layer and dielectric material 30 is silicon nitride. Silicon dioxide layer 28 cooperates with silicon nitride layer 30 to form a gate dielectric material 32. Silicon dioxide layer 28 and silicon nitride layer 30 may be formed by techniques known to those skilled in the art including thermal oxidation, chemical vapor deposition, and the like. Preferably, gate dielectric material 32 has a thickness ranging from approximately 0.8 nm to approximately 2.0 nm. Even more preferably, gate dielectric material 32 has a thickness of approximately 1.3 nm. It should be understood that gate dielectric material 32 is not limited to being two layers of dielectric material or a layer of silicon nitride disposed on a layer of silicon dioxide. For example, gate dielectric material 32 may be comprised of a material having a high dielectric constant (κ), e.g., greater than 3.9, a single layer of oxide, or a combination thereof.

A layer of polysilicon 34 is formed on gate dielectric material 32 using, for example, a chemical vapor deposition technique. A suitable range of thicknesses for polysilicon layer 34 is between approximately 1 nm and approximately 2 nm. A layer of photoresist is deposited on polysilicon layer 34 and patterned to form etch mask 36.

Figure 4:
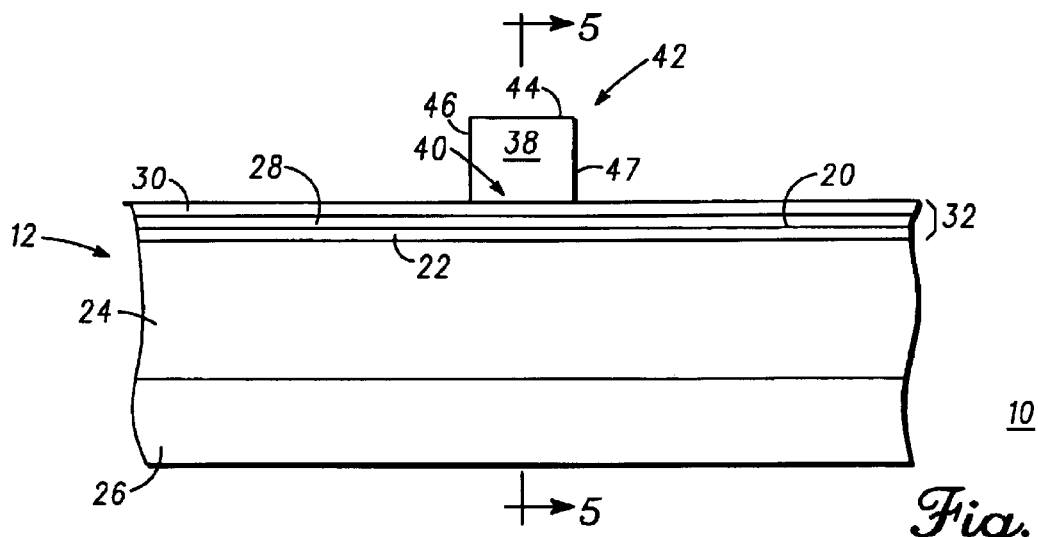
FIG. 4 is a cross-sectional side view of the semiconductor device of FIG. 3 further along in processing.

Referring now to FIG. 4, polysilicon layer 34 is etched using an etch chemistry that preferentially etches polysilicon, i.e., an etch chemistry selective to photoresist etch mask 36. By way of example, polysilicon layer 34 is etched using an anisotropic Reactive Ion Etch (RIE) and an etchant species that is selective to photoresist. Optionally, gate dielectric material 32, i.e., silicon dioxide layer 28 and silicon nitride layer 30, may be anisotropically etched after etching polysilicon layer 34. Methods for etching polysilicon and gate dielectric material are well known to those skilled in the art. Etch mask 36 is removed. The remaining portion 38 of polysilicon layer 34 serves as the gate for semiconductor device 10. The portion 40 of gate dielectric material 32 between gate 38 and substrate 22 serves as a gate dielectric. Gate 38 and gate dielectric 40 cooperate to form a gate structure 42. Gate structure 42 has a gate surface 44 and opposing sidewalls 46 and 47.

Figure 5:
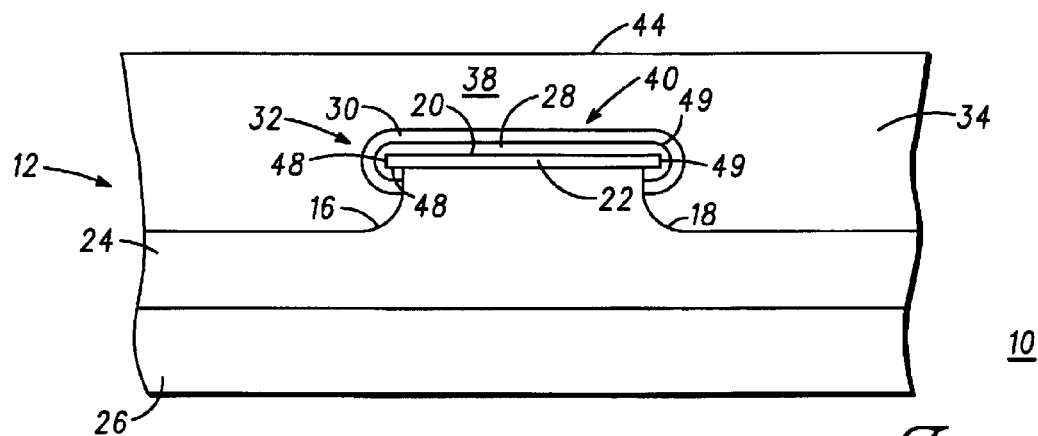
FIG. 5 is a cross-sectional side view of the semiconductor device of FIG. 4 taken along section line 5—5.

Briefly referring to FIG. 5, a cross-sectional view taken along section line 5—5 of FIG. 4 is shown. What is shown in FIG. 5 is silicon layer 22, silicon dioxide layer 24, and silicon layer 26 of mesa isolation structure 14. It should be noted that sidewalls 16 and 18 extend under silicon layer 22 because portions of silicon dioxide 24 layer have been etched during the manufacture of semiconductor device 10. In particular, silicon dioxide layer 24 may be etched during the cleaning steps performed in preparation for forming polysilicon layer 34. This etching, also referred to as underetching, can be controlled such that a predetermined amount of silicon dioxide layer 24 is underetched. Preferably, the amount of silicon dioxide layer 24 that is etched from each side, i.e., from sidewalls 16 and 18, ranges between approximately 10 nm and approximately 30 nm. Even more preferably, the amount of silicon dioxide layer 24 that is etched from each side is approximately 20 nm. Because of the underetching, gate dielectric material 32 wraps around opposing sides 48 and 49 of silicon layer 22. Likewise, polysilicon layer 34 wraps around the portions of gate dielectric 40 that are adjacent opposing sides 48 and 49.

Figure 6:
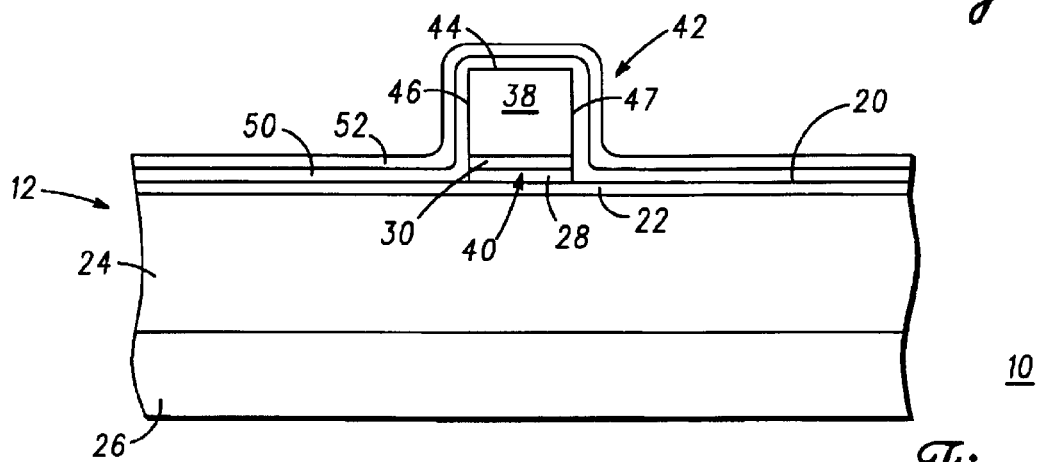
FIG. 6 is a cross-sectional side view of the semiconductor device of FIGS. 4 and 5 further along in processing.

Referring now to FIG. 6, a layer of silicon dioxide 50 having a thickness ranging between approximately 2.5 nm and approximately 10 nm is formed on gate 38 and on silicon nitride layer 30. A layer of silicon nitride 52 having a thickness ranging between approximately 5 nm and approximately 50 nm is formed on silicon dioxide layer 50. Preferably, silicon dioxide layer 50 has a thickness of 5 nm and silicon nitride layer 52 has a thickness of 30 nm.

Figure 7:
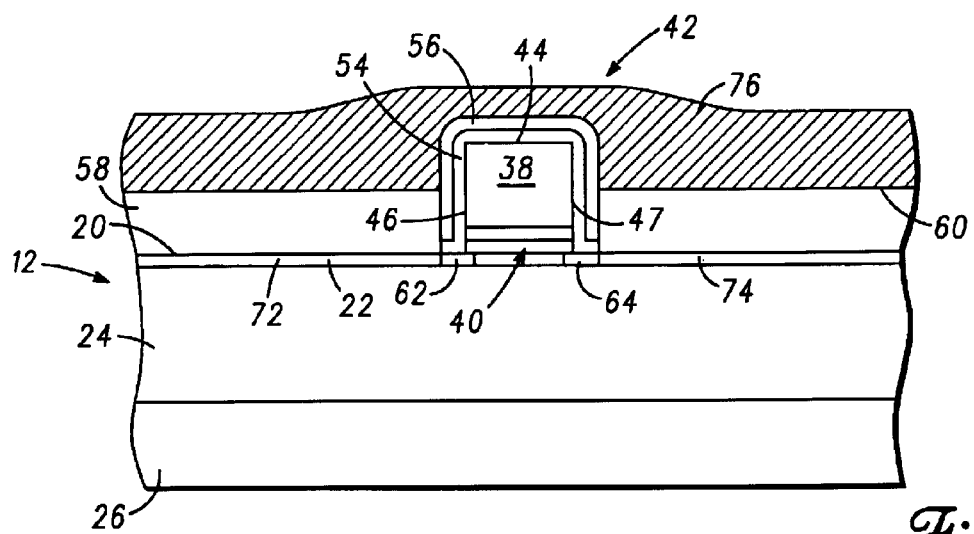
FIG. 7 is a cross-sectional side view of the semiconductor device of FIG. 6 further along in processing.

Referring now to FIG. 7, silicon nitride layer 52 and silicon dioxide layer 50 are etched using anisotropic reactive ion etching. After the anisotropic etching, a portion 54 of silicon dioxide layer 50 and a portion 56 of silicon nitride layer 52 remain over gate structure 42 and the portions of silicon layer 22 adjacent gate structure 42. It should be noted that if gate dielectric material 32 was not anisotropically etched after the formation of gate 38 as described with reference to FIG. 4, gate dielectric material 32 may be anisotropically etched after anisotropically etching silicon nitride layer 52 and silicon dioxide layer 50.

A layer of silicon 58 having a surface 60 and a thickness ranging between approximately 15 nm and approximately 45 nm is grown on the exposed portions of silicon layer 22. Preferably, silicon layer 58 is grown using a technique of selective epitaxial growth. It should be understood that silicon layer 58 is not limited to being silicon, but can be any suitable semiconductor material such as, for example, silicon germanium or germanium.

An impurity material of N type conductivity such as, for example, arsenic or phosphorus, is implanted into silicon layer 58 to form doped regions 62 and 64 that serve as source and drain extension regions, respectively. Preferably, source extension region 62 extends under gate structure 42 from gate side 46 and drain extension region 64 extends under gate structure 42 from gate side 47. Extension regions 62 and 64 may extend into dielectric layer 24. By way of example, extension regions 62 and 64 have a concentration ranging from approximately $1 \times 10^{18}$ atoms per centimeter cubed (atoms/cm$^3$) to approximately $5 \times 10^{20}$ atoms/cm$^3$. Preferably, extension regions 62 and 64 are formed by using a tilt angle implant having a tilt angle that ranges between approximately 7 degrees and approximately 45 degrees, where the angle is formed between surface 60 and an imaginary line extending perpendicularly from surface 60. Suitable implant parameters for forming source and drain extension regions 62 and 64, respectively, include an implant dose ranging between approximately $10^{12}$ ions per centimeter squared (ions/cm$^2$) and approximately $10^{15}$ ions/cm$^2$ and an implant energy ranging between approximately 1 kilo electron volt (keV) and approximately 20 keV. After the implant, semiconductor device 10 is annealed. Although source and drain extension regions 62 and 64, respectively, are formed using an angled or tilt angle implant, it should be understood that the implant may implant other portions of silicon layers 58 and 72 than those under gate structure 42.

A source/drain implant is performed to form a source region 72 and a drain region 74. The source/drain implant may also dope gate structure 42. A suitable set of parameters for the source/drain implant includes implanting an N type impurity material such as, for example, arsenic at a dose ranging between approximately $1 \times 10^{14}$ ions/cm$^2$ and approximately $1 \times 10^{16}$ ions/cm$^2$ and using an implant energy ranging between approximately 20 keV and approximately 50 keV. The doped semiconductor material is annealed by heating to a temperature between approximately 800 degrees Celsius (° C.) and 1,100° C.

A layer of refractory metal 76 is conformally deposited on silicon surface 60 and portion 56 of silicon nitride layer 52. By way of example, the metal of refractory metal layer 76 is nickel having a thickness ranging between approximately 50 Å and approximately 150 Å. The refractory metal is heated to a temperature ranging between 350° C. and 500° C.

Figure 8:
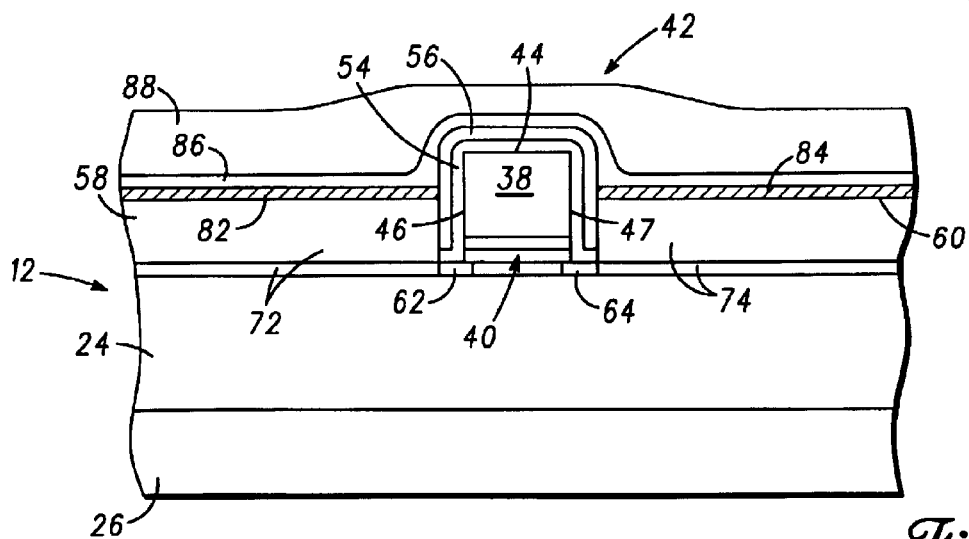
FIG. 8 is a cross-sectional side view of the semiconductor device of FIG. 7 further along in processing.

Referring now to FIG. 8, the heat treatment causes the nickel to react with the silicon to form nickel silicide (NiSi) in all regions in which the nickel is in contact with silicon. Thus, a nickel silicide region 82 is formed in source region 72 and a nickel silicide region 84 is formed in drain region 74. The portions of the nickel adjacent portion 56 of nitride layer 52 remain unreacted. After formation of nickel silicide regions 82 and 84, any unreacted nickel silicide is removed. It should be understood that the type of silicide is not a limitation of the present invention. For example, other suitable silicides include titanium silicide (TiSi), platinum silicide (PtSi), cobalt silicide (CoSi$_2$), and the like. As those skilled in the art are aware, silicon is consumed during the formation of silicide and the amount of silicon consumed is a function of the type of silicide being formed.

A layer dielectric material 86 having a thickness ranging between approximately 250 Angstroms (Å) and approximately 750 Å is formed on silicide regions 82 and 84 and on portion 56 of silicon nitride layer 52. A layer of dielectric material 88 having a thickness ranging between approximately 500 Å and approximately 2,500 Å is formed on dielectric layer 86. By way of example, dielectric material 86 is silicon oxynitride having a thickness of approximately 500 Å and dielectric layer 88 is oxide formed by decomposition of tetraethylorthosilicate (TEOS) having a thickness of approximately 1,500 Å.

Figure 9:
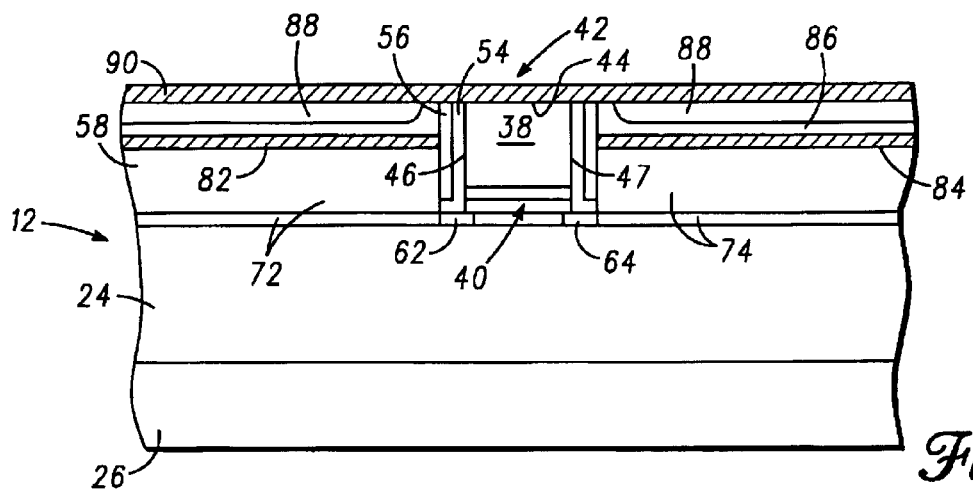
FIG. 9 is a cross-sectional side view of the semiconductor device of FIG. 8 further along in processing.

Referring now to FIG. 9, TEOS layer 88 is planarized using, for example, a Chemical Mechanical Polishing (CMP) technique having a high selectivity to polysilicon. Thus, the planarization stops on gate 38. A layer of refractory metal 90 is conformally deposited on silicon surface 44, TEOS layer 88, the exposed portions of silicon oxynitride layer 86 and the exposed portions of silicon dioxide layer 54 and silicon nitride layer 56. By way of example, the metal of refractory metal layer 90 is nickel having a thickness of approximately 700 Å. The refractory metal is heated to a temperature ranging between approximately 350° C. and 500° C.

Figure 10:
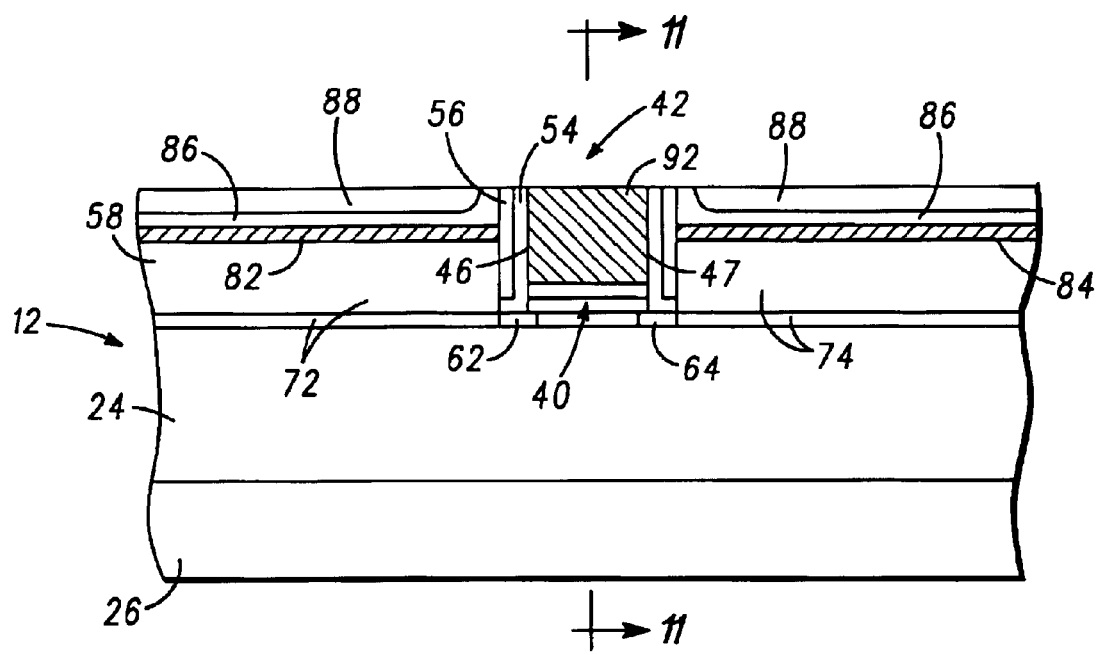
FIG. 10 is a cross-sectional side view of the semiconductor device of FIG. 9 further along in processing.

Referring now to FIG. 10, the heat treatment causes the nickel to react with the silicon to form nickel silicide (NiSi) in all regions in which the nickel is in contact with silicon. Thus, a nickel silicide region 92 is formed from gate 38. The portions of the nickel disposed on non-silicon regions, i.e., TEOS layer 88, the exposed portions of SiON layer 86, and exposed portions of silicon dioxide layer 54 and silicon nitride layer 56 remain unreacted. After formation of nickel silicide region 92, any unreacted nickel silicide is removed. It should be understood that the type of silicide is not a limitation of the present invention. For example, other suitable silicides include titanium silicide (TiSi), platinum silicide (PtSi), cobalt silicide (CoSi$_2$), and the like. As those skilled in the art are aware, silicon is consumed during the formation of silicide and the amount of silicon consumed is a function of the type of silicide being formed.

Figure 11:
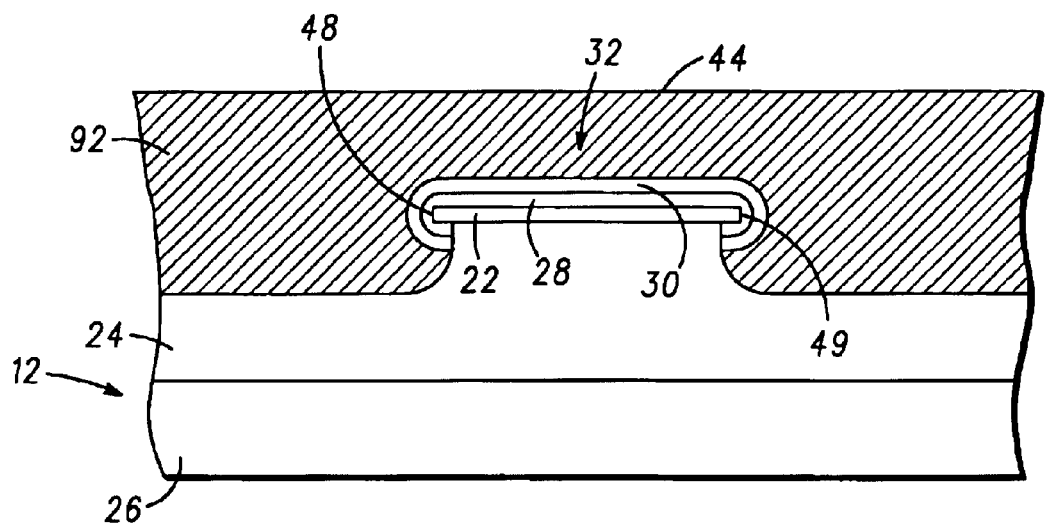
FIG. 11 is a cross-sectional side view of the semiconductor device of FIG. 10 taken along section line 11—11.

Briefly referring to FIG. 11, a cross-sectional side view of semiconductor device 10 along section line 11—11 of FIG. 10 is illustrated. What is shown in FIG. 11 is silicon layer 22 disposed on dielectric layer 24, which is disposed on body of semiconductor material 26. Gate dielectric 40, which is comprised of silicon dioxide layer 28 and silicon nitride layer 30, wraps around opposing sides 48 and 49 of silicon layer 22. Likewise, nickel silicide region 92 of gate 38 wraps around the portions of gate dielectric 40 that are adjacent opposing sides 48 and 49.

By now it should be appreciated that a strained semiconductor device suitable for use in an integrated circuit has been provided. An advantage of the present invention is that the semiconductor device can be manufactured to be under compressive or tensile stress by adjusting the width of the gate, selecting the annealing temperature, and underetching the mesa structure. The semiconductor device can include one of these techniques or a combination of more than one of these techniques to provide stress. Thus, either the electron mobility, the hole mobility or the mobility of both the electrons and the holes can be optimized. The increased mobility results in increased device performance. For example, NMOS and PMOS transistors manufactured in accordance with an embodiment of the present invention have CV/I delays as small as 0.2 picoseconds (ps) and 0.3 ps, respectively. Another advantage of the present invention is that the strain is defined at the last higher temperature processing step which helps prevent subsequent relaxation. Yet another advantage is that the high mobility increases the drive current of the device, while the quantization effects in such an ultra-thin semiconductor-on-insulator device increases its threshold voltage, thereby improving the offset current.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for manufacturing a semiconductor device, comprising:

providing a semiconductor substrate;

forming a mesa structure from the semiconductor substrate, wherein the mesa structure has a first surface and first and second sidewalls;

forming a gate structure over the mesa structure, wherein the gate structure has a gate surface and first and second sides, and wherein first and second portions of the gate structure wrap around the first and second sides and are disposed on the first and second sidewalls, respectively; and doping portions of the semiconductor substrate adjacent the first and second sides of the gate structure.

2. The method of claim 1, wherein forming the gate structure includes forming a first layer of dielectric material over the mesa structure.

3. The method of claim 2, wherein forming the gate structure includes forming a second layer of dielectric material over the first layer of dielectric material.

4. The method of claim 2, wherein forming the first layer of dielectric material includes forming portions of the first layer of dielectric material over the first and second sidewalls, and wherein a portion of the first layer of dielectric material serves as the first portion of the gate structure and another portion of the first layer of dielectric material serves as the second portion of the gate structure.

5. The method of claim 4, wherein forming portions of the first layer of dielectric material over the first and second sidewalls includes oxidizing the first and second sidewalls.

6. The method of claim 2, further including forming a layer of semiconductor material over the semiconductor substrate adjacent the first and second sides of the gate structure.

7. The method of claim 6, wherein forming the layer of semiconductor material includes selectively growing the layer of semiconductor material.

8. The method of claim 7, wherein selectively growing includes selectively growing a semiconductor material selected from the group of semiconductor materials consisting of silicon, silicon germanium, and germanium.

9. The method of claim 7, wherein doping the semiconductor substrate comprises:

implanting a dopant into the layer of semiconductor material adjacent the first and second sides of the gate structure using an angled implant; and implanting additional dopant into the layer of semiconductor material adjacent the first and second sides of the gate structure using a zero degree implant.

10. The method of claim 6, further including forming silicide from the layer of semiconductor material.

11. The method of claim 6, further including forming silicide from the gate structure.

12. The method of claim 11, wherein forming silicide from the gate structure includes forming nickel silicide.

13. The method of claim 1, wherein providing the semiconductor substrate includes providing a semiconductor-on-insulator semiconductor substrate.

14. A method for manufacturing a strained semiconductor device suitable for use in an integrated circuit, comprising:

providing a semiconductor-on-insulator mesa isolation structure, the semiconductor-on-insulator mesa isolation structure having a top surface and first and second sidewalls;

forming a gate dielectric material on the top surface and the first and second sidewalls;

forming a gate on the gate dielectric material, wherein the gate and the gate dielectric material cooperate to form a gate structure having a top surface and gate sidewalls;

forming a semiconductor material on portions of the top surface of the mesa isolation structure adjacent to the first and second sidewalls of the mesa isolation structure, wherein the semiconductor material wraps around portions of the gate sidewalls;

forming silicide from the semiconductor material; and forming silicide from the gate, wherein the silicide from the gate strains the semiconductor device.

15. The method of claim 14, wherein providing the semiconductor-on-insulator mesa isolation structure includes forming portions of the first and second sidewalls to be below the top surface of the semiconductor-on-insulator mesa isolation structure.

16. The method of claim 14, wherein forming the gate dielectric material includes oxidizing the portions of first and second sidewalls below the top surface of the semiconductor-on-insulator structure.

17. The method of claim 14, wherein the forming the silicide from the gate includes forming nickel silicide.

18. The method of claim 14, wherein forming the semiconductor material on portions of the top surface of the mesa isolation structure includes forming a protective material over the gate before forming the semiconductor material.

19. A method for straining a semiconductor device, comprising:

providing a semiconductor substrate comprising a first layer of semiconductor material disposed over a first layer of dielectric material, the semiconductor substrate having a top surface and isolation sidewalls;

forming a gate structure on the semiconductor substrate, the gate structure having a gate surface, first and second opposing gate sidewalls, and third and fourth opposing gate sidewalls, wherein forming the gate structure includes:

forming a second layer of dielectric material on a portion of the isolation sidewalls; and forming a second layer of semiconductor material over a portion of the second layer of dielectric material, wherein the second layer of dielectric material and the second layer of semiconductor material wrap around the third and fourth opposing gate sidewalls; and forming silicide from the gate surface and the second layer of semiconductor material, wherein the silicide strains the semiconductor material of the semiconductor substrate.

20. The method of claim 19, further including forming the second layer of dielectric material on the portions of the first layer of semiconductor material adjacent the third and fourth opposing gate sidewalls.

21. The method of claim 19 further including protecting the gate structure before forming the second layer of semiconductor material.

22. The method of claim 19 further including doping the second layer of semiconductor material.

23. The method of claim 22, further including forming silicide from the second layer of semiconductor material.

24. The method of claim 23, further including protecting the silicide formed from the second layer of semiconductor material before forming the silicide from the gate surface.

* * * * *